United States Patent
Kumph et al.

(10) Patent No.: US 12,249,748 B2
(45) Date of Patent: Mar. 11, 2025

(54) EDGE CAPACITIVE COUPLING FOR QUANTUM CHIPS

(71) Applicant: INTERNATIONAL BUSINESS MACHINES CORPORATION, Armonk, NY (US)

(72) Inventors: Muir Kumph, Croton on Hudson, NY (US); Oliver Dial, Yorktown Heights, NY (US); John Michael Cotte, New Fairfield, CT (US); David Abraham, Croton, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 238 days.

(21) Appl. No.: 17/935,023

(22) Filed: Sep. 23, 2022

(65) Prior Publication Data

US 2024/0104414 A1    Mar. 28, 2024

(51) Int. Cl.
| | |
|---|---|
| *H01P 5/02* | (2006.01) |
| *G06N 10/40* | (2022.01) |
| *H01P 11/00* | (2006.01) |
| *H01R 12/72* | (2011.01) |
| *H02J 50/05* | (2016.01) |

(52) U.S. Cl.
CPC ............ *H01P 5/028* (2013.01); *G06N 10/40* (2022.01); *H01P 5/02* (2013.01); *H01P 11/003* (2013.01); *H01R 12/721* (2013.01); *H02J 50/05* (2016.02)

(58) Field of Classification Search
CPC ........... H01P 5/028; H01P 5/02; H01P 11/003
USPC ............................................... 333/24 C, 99 S
See application file for complete search history.

(56) References Cited

U.S. PATENT DOCUMENTS

| | | |
|---|---|---|
| 3,983,546 A | 9/1976 | Zappe |
| 6,661,022 B2 | 12/2003 | Morie et al. |
| 7,932,515 B2 | 4/2011 | Bunyk |
| 9,893,262 B2 | 2/2018 | Thompson et al. |
| 10,134,972 B2 | 11/2018 | Oliver et al. |

(Continued)

FOREIGN PATENT DOCUMENTS

| | | |
|---|---|---|
| CN | 112215359 A | 1/2021 |
| WO | 2023191848 A2 | 10/2023 |

OTHER PUBLICATIONS

Gold, A. et al., "Entanglement Across Separate Silicon Dies in a Modular Superconducting Qubit Device", rXiv:2102.13293v2 (2021), 9 pgs.

(Continued)

*Primary Examiner* — Benny T Lee
(74) *Attorney, Agent, or Firm* — Intelletek Law Group, PLLC; Gabriel Daniel, Esq.

(57) ABSTRACT

A quantum computing chip device provides an edge based capacitive, intra-chip connection. A first chip includes a first signal line with a distal end positioned proximate to or on an edge of the first chip and a proximal end positioned away from the edge of the first chip. A second chip includes a second signal line with a distal end positioned proximate to or on an edge of the second chip and a proximal end positioned away from the edge of the second chip. The first signal line and the second signal line are configured to conduct a signal. The second signal line of the second chip is disposed in alignment for a capacitive bus connection to the first signal line of the first chip.

22 Claims, 14 Drawing Sheets

(56) References Cited

U.S. PATENT DOCUMENTS

| | | | |
|---|---|---|---|
| 10,886,049 B2 | 1/2021 | Strong | |
| 11,195,799 B2 | 12/2021 | Shao et al. | |
| 2010/0244991 A1* | 9/2010 | Washiro | H04B 5/22 333/219 |
| 2013/0222401 A1* | 8/2013 | Ito et al. | H01L 23/66 345/519 |
| 2016/0364653 A1 | 12/2016 | Chow | |
| 2017/0133336 A1 | 5/2017 | Oliver | |
| 2017/0308804 A1 | 10/2017 | Wabnig et al. | |
| 2018/0013052 A1 | 1/2018 | Oliver | |
| 2019/0165240 A1* | 5/2019 | Brink et al. | H01P 5/028 |
| 2021/0305315 A1 | 9/2021 | Solgun | |
| 2022/0121978 A1 | 4/2022 | Woods et al. | |
| 2023/0162080 A1 | 5/2023 | Kikuchi | |
| 2023/0359917 A1 | 11/2023 | Abraham | |
| 2023/0359918 A1 | 11/2023 | Phung | |

OTHER PUBLICATIONS

Conner, C. R. et al. "Superconducting qubits in a flip-chip architecture", Applied Physics Letters (2021), vol. 118: 232602, 7 pgs.
International Search Report and Written Opinion issued Feb. 13, 2024 in related international patent application No. PCT/IB2023/058763, 21 pgs.

\* cited by examiner

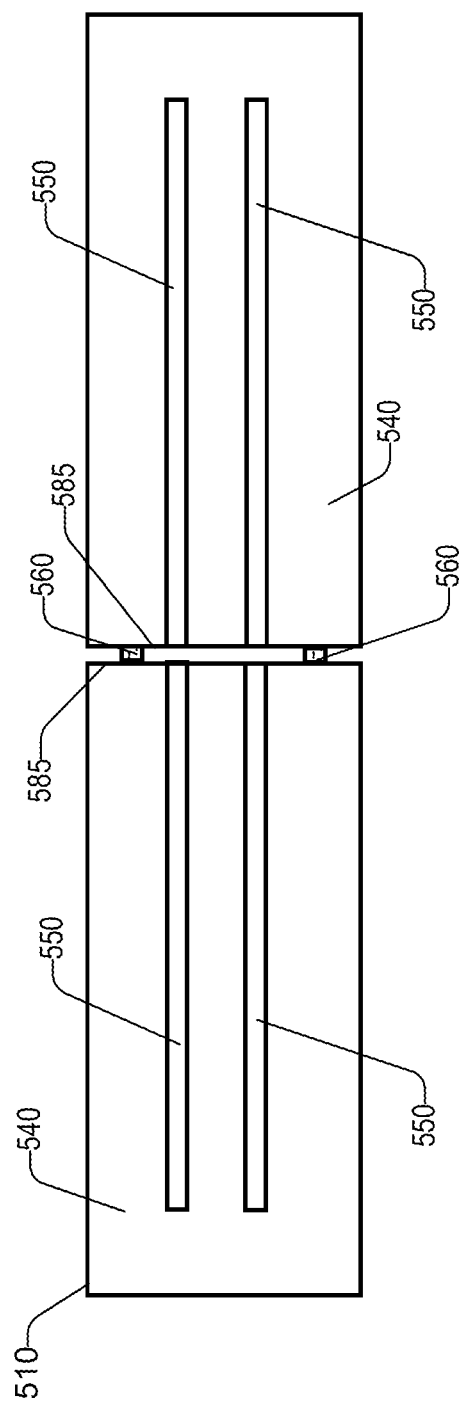

EDGE CAPACITIVE COUPLING FOR QUANTUM CHIPS

BACKGROUND

Technical Field

The present disclosure generally relates to electrical devices, and more particularly, to edge capacitive coupling for quantum chips.

Description of the Related Art

Quantum computing chips are generally larger than those used in conventional CMOS electronics. At some point, the ability to create and yield larger and larger quantum chips becomes difficult. At this point, in order to increase the size of the quantum device, it becomes desirable to connect individual quantum chips together so as to effectively form a larger device. When connecting two qubits together, there is a requirement that a qubit state is maintained between the two qubits. However, qubit circuits are highly susceptible to picking up interference or some other undesirable signal from the environment. In addition, the connection between qubits should have low loss. "Loss" in this context is generally characterized by the frequency range of a qubit and associated resonant structures on the qubit chip, which may be, for example, on the order of several Gigahertz.

In electrical connections where a dielectric is present, the loss tangent of dielectric materials that are generally used are typically so lossy in nature that the use of such dielectric material in a quantum computing system would destroy the quantum state in a qubit chain. For example, a dielectric material with a loss tangent of 1×10−3 and which is intimately connected to the qubits and resonators present on the quantum device which are operating in the Gigahertz range essentially limits device operation to roughly a microsecond before the energy dissipates and the qubit state is lost between qubit connections. Practically speaking, a suitable dielectric material would require a loss tangent on the order of 10−6 or 10−7 to be usable in a qubit connection, but such dielectric material are scarce and their availability and use of such dielectric material is impractical. Accordingly, there are limited material options available to construct a qubit electrical connection.

SUMMARY OF THE INVENTION

According to an embodiment of the present disclosure, a quantum computing chip device is provided. The quantum computing chip device includes a first chip. The first chip includes a first signal line. The first signal line includes a distal end positioned proximate to or on an edge of the first chip and a proximal end positioned away from the edge of the first chip. The quantum computing chip device also includes a second chip. The second chip includes a second signal line. The second signal line includes a distal end positioned proximate to or on an edge of the second chip and a proximal end positioned away from the edge of the second chip. The second signal line of the second chip is disposed in alignment for a capacitive bus connection to the first signal line of the first chip. The first signal line and the second signal line are configured to conduct a signal. The disposition of the first signal line of the first chip relative to the second signal line of the second chip provide an improvement over chip to chip coupling in quantum computing devices. By using an edge based coupling, an indirect signal connection is made through the capacitance field generated by the first signal line and the second signal line. The edge based capacitive coupling arrangement increases the number of qubits transmitted between quantum computing elements in a system which increases the quantum computing efficiency of the system.

In an embodiment, which may be combined with the preceding embodiments, the distal end of the first signal line is spaced from the edge of the first chip by substrate material. By allowing some substrate material to be in between the signal line and the edge of the chip, a guaranteed spacing is provided between signal lines of cooperating chips forming the capacitive based coupling. The physical spacing prevents inadvertent galvanic connections between chips from occurring which can lose qubits in the intra-chip connection.

According to an embodiment of the present disclosure, a quantum computing chip is provided. The quantum computing chip includes a substrate. The substrate includes a first end and a second end. The quantum computing chip also includes a first superconducting metal signal line. The first superconducting metal line includes a first end positioned intermediate the first end of the substrate and the second end of the substrate. A second end of the superconducting metal line is positioned on an edge of the second end of the substrate. The quantum computing chip also includes a second superconducting metal signal line. The second superconducting metal signal line includes a first end positioned intermediate the first end of the substrate and the second end of the substrate. A second end of the second superconducting metal signal line is positioned proximate an edge of the second end of the substrate. The first superconducting metal signal line and the second superconducting metal signal line are configured to generate a capacitive field. The embodiment improves of intra-chip connections in quantum computing applications by creating an edge-based capacitance field for conducting signals. The edge-based capacitance signal allows for adjacent chips to transmit signals to one another even if the chips are part of typically incompatible technologies that do not traditionally connect to each other on the intra-chip level.

In an embodiment, which may be combined with the preceding embodiments, the second end of the first superconducting metal signal line and the second end of the second superconducting metal signal line are positioned in a route extending from a top surface of the substrate, over the edge of the second end of the substrate, and over a side wall of the second end of the substrate.

According to an embodiment of the present disclosure, a method of manufacturing a quantum computing device is provided. The method includes forming a chip substrate. One or more signal lines of a superconducting metal are formed on a top surface of the first chip substrate, proximate to or in contact with, an edge of the top surface of the first chip substrate. A second chip substrate is formed. One or more signal lines of the superconducting metal are formed on the top surface of the second chip substrate, proximate to or in contact with, an edge of the second top surface of the second chip substrate. A first distal end of the first of one or more signal lines is positioned in proximity to a second distal end of the second one or more signal lines. The first one or more signal lines and the second one or more signal lines form a capacitive based bus connection when a signal is passed through either the first one or more signal lines or the second one or more signal lines. The method describes an improvement over current manufacturing methods since other methods are usually designed for galvanic connections, whose yields are a challenge to test prior to cutting a chip die. Discontinuity and other defects in a galvanic based line cannot be tested until the chip is diced. The capacitive based signal lines formed in the above embodiment can be pre-tested prior to chip dicing since the integrity of signal lines is independent of other signal lines.

In an embodiment, which may be combined with the preceding embodiments, the method includes forming a first conductive bump on the first one or more signal lines and forming a second conductive bump on the second one or more signal lines. The first conductive bump and the second conductive bump form the capacitive based bus connection. Typically, bumps only serve as physical connection points for wires or traces or serve as a spacing feature to create clearance between different layers of material. As may be appreciated, the bumps of the instant disclosure may provide a dual function as spacers to adjacent modules while providing the edge based capacitive connection.

The techniques described herein may be implemented in a number of ways. Example implementations are provided below with reference to the following figures.

BRIEF DESCRIPTION OF THE DRAWINGS

The drawings are of illustrative embodiments. These drawings do not illustrate all embodiments. Other drawings may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, the numeral refers to the same or like components or steps.

FIG. 5B is a top view of a quantum computing device connection, using two of the interposers shown in FIG. 5A.

DETAILED DESCRIPTION OF THE INVENTION

Overview

Figure 1:
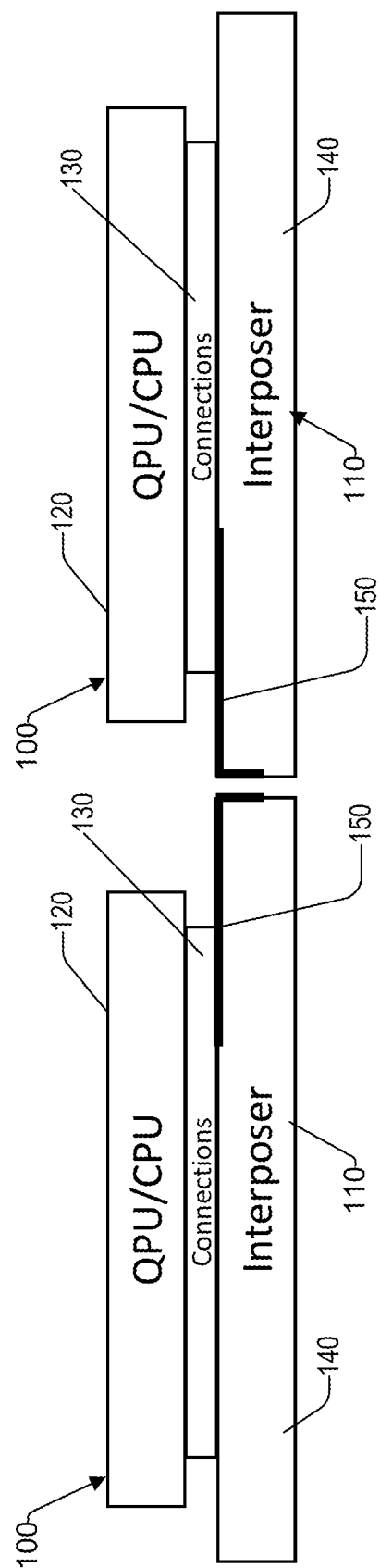
FIG. 1 is a diagrammatic side view of a quantum computing device with an edge based capacitive connection between a pair of quantum computing modules according to an embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms "first," "second," etc., may be used herein to describe various elements, these elements should not be limited by these terms. These terms are only used to distinguish one element from another. For example, a "first element" could be termed a "second element," and, similarly, a "second element" could be termed a "first element," without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and the shapes thereof do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

Referring to the Figures, embodiments of the subject technology provide electrical connections in a quantum computing circuit. The subject electrical structure maintains the qubit state as a signal is propagated along the readout chain in a quantum computing circuit. In an exemplary embodiment, quantum computing devices of the subject technology use capacitive coupling on the edges of chips or modules in the circuit to provide a bus connection between different circuit elements. The capacitor structure disclosed herein may use superconducting lines that are positioned proximate to or on the edge surfaces of adjacent chips or modules. When placed in proximity to one another, the superconducting line(s) from one chip create a capacitive relationship with the superconducting line(s) of the adjacent chip. As will be appreciated, the dielectric feature in this structure provides the quality factor needed to transmit a qubit output between circuit elements while maintaining the integrity of the qubit state in the output.

Referring now to FIG. 1, a pair of quantum computing modules 100 are shown that are illustrative of the subject technology. The quantum computing modules 100 may be part of a larger quantum computing system (not shown) and in some embodiments, may represent a quantum computing device in that there may be a circuit formed between the computing elements on one module 100 having an output is being transmitted to the second module 100. In a general embodiment, a quantum computing module 100 includes an interposer chip 110, a quantum processing unit (QPU) or central processing unit (CPU) 120. In a QPU, there may exist multiple interconnected qubits. The QPU/CPU 120 may be coupled to the interposer chip 110. Signals from the QPU/CPU 120 may be transmitted to the interposer chip 110 through a layer of connections 130. The interposer chip 110 includes a substrate 140. In some embodiments, the substrate 140 may be for example, silicon, sapphire, magnesium oxide, or quarts, however other materials may be used depending on the application. One or more signal lines 150 is positioned on or proximate an edge of one substrate 140, in alignment with signal line(s) 150 (that is also positioned on or proximate an edge) of the second substrate 140 to create a capacitive bus connection that is shared between the first and second interposers 110. The signal lines 150 define the capacitor element for the respective cooperating interposers 140. In general, the signal lines 150 use superconducting metal to form a superconductive capacitor. In some embodiments, the signal lines 150 of respective modules 100 may be spaced by air providing a vacuum-gap. The capacitive bus connection of the quantum computing device has a low loss tangent since the capacitive bus connection avoids using dielectrics with a poor quality factor. Accordingly, signals from one QPU/CPU 120 can be transmitted to the second QPU/CPU 120 with the qubit state intact.

In the following, FIGS. 2A/B, 3A/B/C, 4A/B, 5A/B, 6A/B and 7A/B show various contemplated embodiments of providing an edge based capacitive connection between quantum computing modules 100 as shown in FIG. 1. Like elements use the same reference numeral updated by series for the figure number. For example, a chip 110 will be called out by numeral "210" in FIGS. 2A/B, "310" in FIGS. 3A/B and so on. Likewise, substrate 140 in FIG. 1, will be called out as "240" in FIGS. 2A/B, "340" in FIGS. 3A/B and so on. Unless stated otherwise, an element described in one embodiment and figure may be the same element, with the same structure in later figures even though it uses a different reference numeral for the embodiment being described. As such, sone some elements that are in common amongst different embodiments may not be repeatedly described or referenced. In addition, references to "proximal ends" should be considered as being on the side of structures that is away from a mating surface or end of the substrate 140 (and the like). References to "distal" should be considered as being the end closest to a mating surface in the structures shown.

Figure 2A:
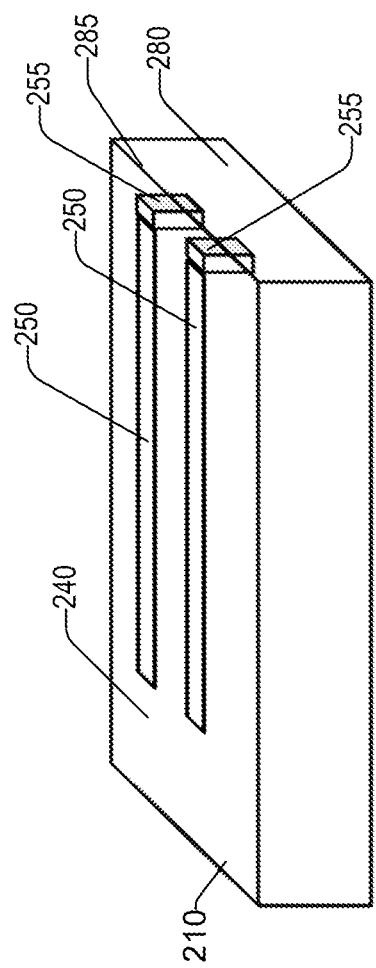
FIG. 2A is a side, top perspective view of an interposer with an edge based capacitor, for use in a quantum computing device, according to an embodiment.
Figure 2B:
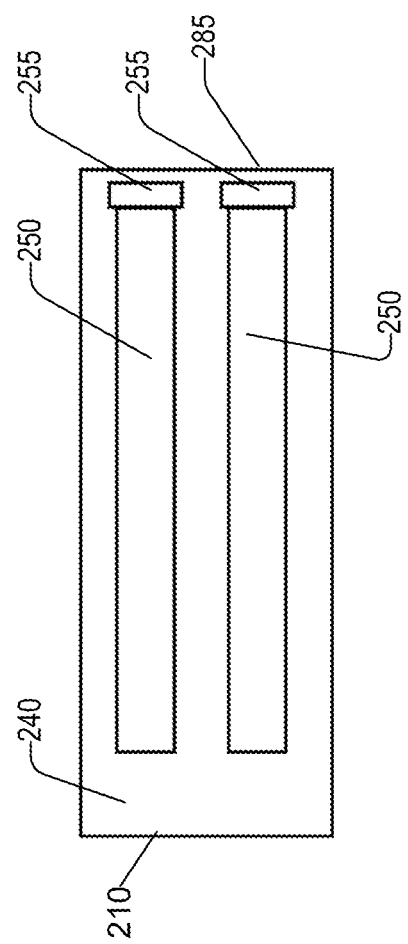
FIG. 2B is a top view of the interposer of FIG. 2A.

Referring now to FIGS. 2A and 2B, an interposer chip 210 is shown according to an embodiment. The interposer chip 210 may include trenches that are etched out from the substrate 240 and lined with superconducting metal defining the capacitor signal line 250. The superconducting metal fills the trenches and extends into the interior, below the top surface of the substrate 240. In some embodiments, the trenches may be filled with dielectric if needed. In the embodiment shown, the trenches may be positioned so that the signal lines 250 terminate proximate but spaced from an edge 285 of an end surface 280 (of FIG. 2) of the substrate 240. The end surface 280 may be a side wall of the chip 210. The end surface 280 may be considered a mating surface, which in this application, will face toward an opposing mating surface of an adjacent interposer chip 210. FIG. 1 may be referenced as an example showing mating surfaces of opposing chips 110 facing each other to provide a capacitive connection. Chips 210 may be diced and then possibly polished in order to place the trenches close to the edge 285 of the substrate 240. In some embodiments, the substrate 240 may be a high-quality monocrystalline material. Some substrate material may remain buffering the distal end of the trench from the mating surface 280, providing some guaranteed spacing of the distal end of the trench to the edge 285. In some embodiments, capacitor pads 255 may be formed on the distal ends of the trenches using the superconducting metal. The capacitor pad 255 may be formed by a liner in a trench but with the outside of the liner disposed to face a neighboring chip 210's mating surface 280. Substrate material may be present between the capacitor pads 285 and the mating surface 280. Placing two chips 210 in proximity of each other with the capacitor pads 285 (or in their absence, distal ends of the capacitor lines 250) facing each other leaves a double gap of substrate material between the pads. In this embodiment, the substrate 240 material serves as the dielectric feature.

Figure 3A:
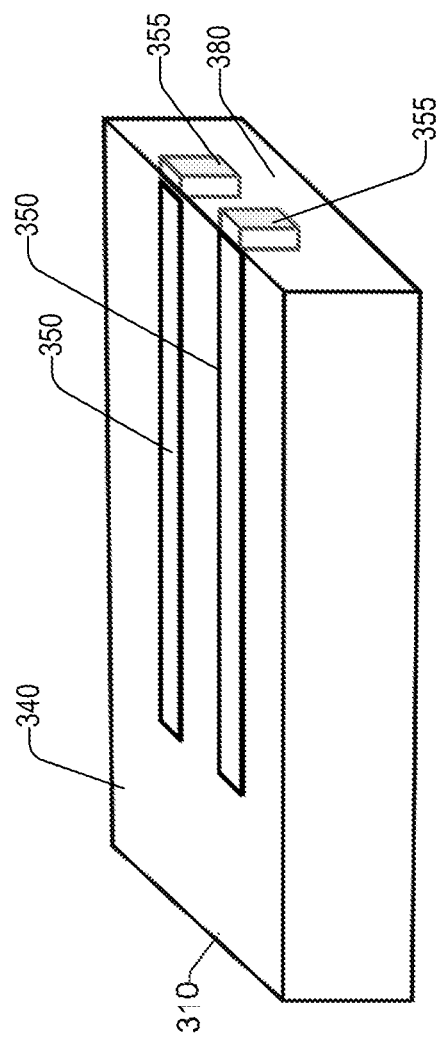
FIG. 3A is a side, top perspective view of an interposer with an edge based capacitor, for use in a quantum computing device, according to another embodiment.
Figure 3B:
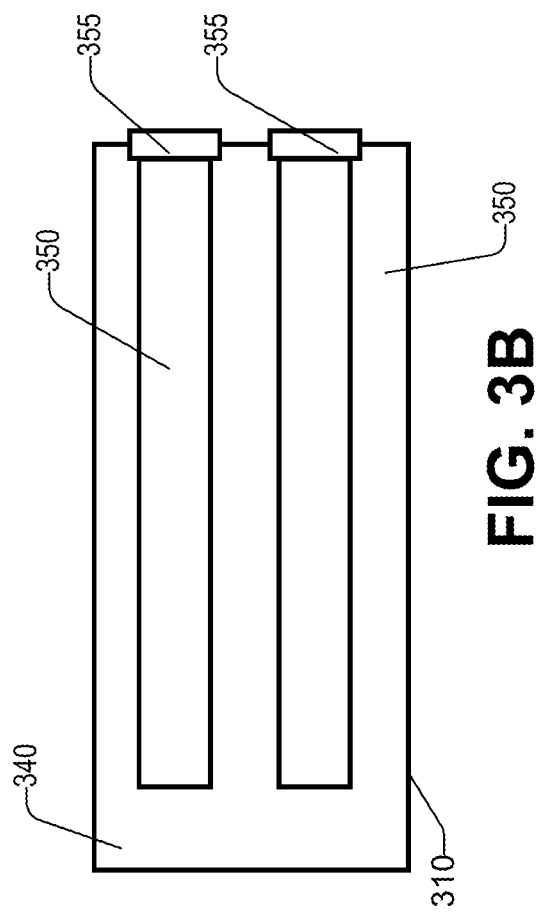
FIG. 3B is a top view of the interposer of FIG. 3A.
Figure 3C:
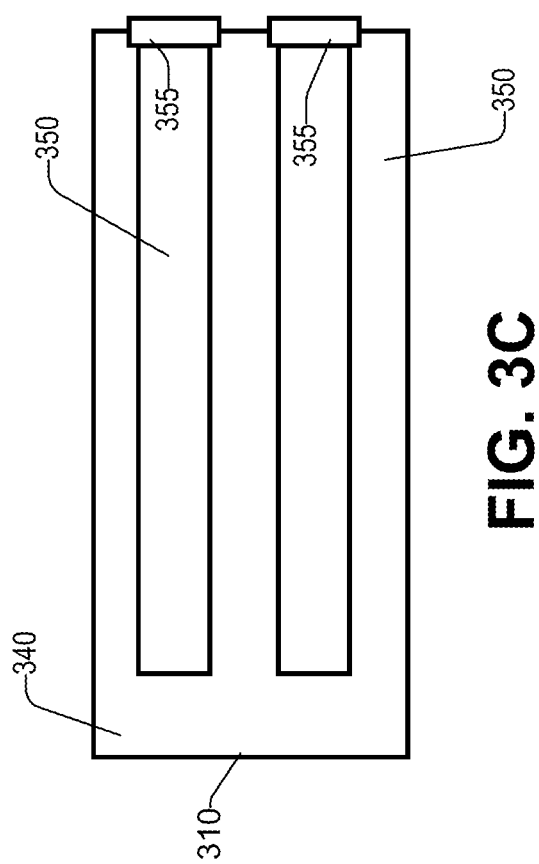
FIG. 3C is a top view of the interposer of FIG. 3B with capacitor plates cut in half by a formation of a trench according to a fabrication process in one embodiment.

Referring now to FIGS. 3A, 3B, and 3C, an interposer chip 310 is shown according to an embodiment. More specifically, FIG. 3A is a side, top perspective view of an interposer with an edge based capacitor, for use in a quantum computing device. FIG. 3B is a top view of the interposer of FIG. 3A. FIG. 3C is a top view of the interposer of FIG. 3B with capacitor plates cut in half by a formation of a trench according to a fabrication process in one embodiment. The interposer chip 310 is similar to the interposer chip 210 (as shown in FIG. 2) except that a different signal lines 350 as a capacitor structure is used. As shown in FIG. 3C, an embodiment depicts a chip structure fabricated by creating a trench in a chip die where capacitor pads 355 are formed, and then cutting through the middle of the trench. The capacitor is then formed by pushing two chip modules together, and the spacing between the capacitor pads 355 is defined by the width of the trench. FIG. 3B does not show the trench formed along the line of the capacitor pads 355.

The interposer chip 310 may include signal lines 350 that extend to the mating surface 380 (FIG. 3A) or protrude through the mating surface 380, so that the superconducting metal is exposed through the mating surface 380. In embodiments including capacitor pads 355, the capacitor pads 355 may be flush with or protrude from the mating surface 380. In this embodiment, fabrication is the same as structure disclosed in FIGS. 2A and 2B, except that the singulation of the chip 310 may occur through the trench, so that the eventual capacitor pad 355 is formed by the liner on the interior wall of the trench. The singulation of chips from a wafer may be performed by mechanical or laser dicing. Dicing may go through a trench and the metal liner of the trench is cut in half and the inner coating serves as the capacitor pad 355. So, cutting occurs through the trench. Here, the inside of the liner is the 'active surface' of the capacitor.

Figure 4A:
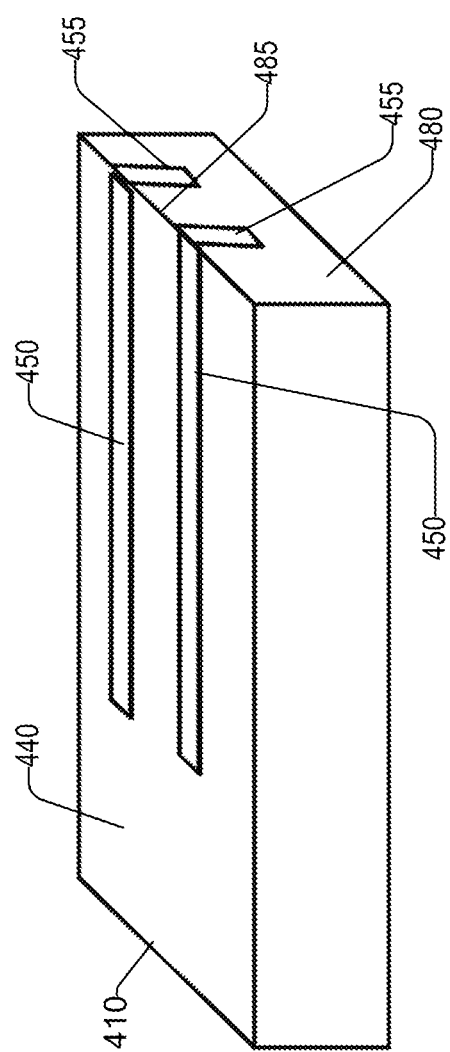
FIG. 4A is a side, top perspective view of an interposer with an edge based capacitor, for use in a quantum computing device, according to an embodiment.
Figure 4B:
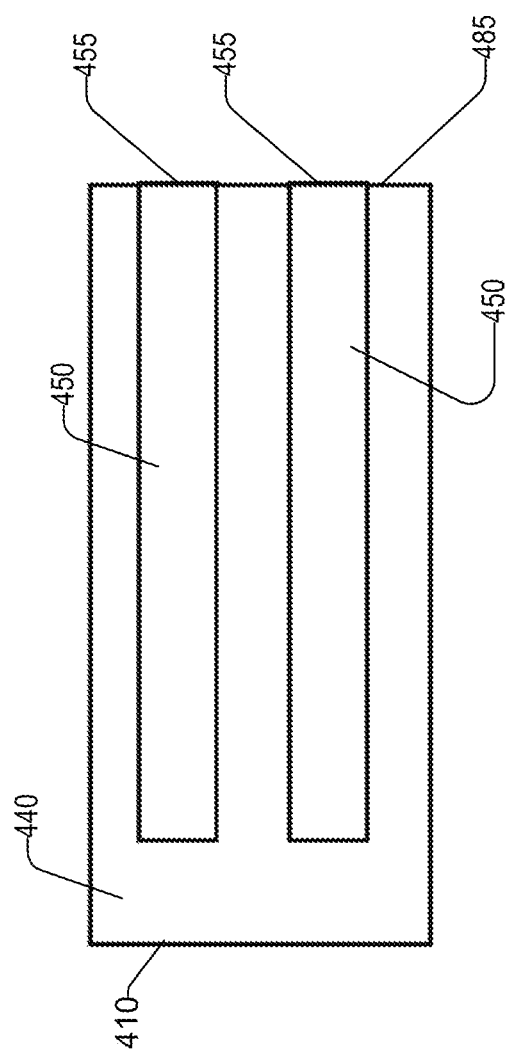
FIG. 4B is a top view of the interposer of FIG. 4A.

FIGS. 4A and 4B show an embodiment similar to the embodiment shown in FIGS. 3A and 3B except that there are no trenches used in forming the signal lines 450. More specifically, FIG. 4A is a side, top perspective view of an interposer with an edge based capacitor, for use in a quantum computing device, according to an embodiment. FIG. 4B. FIG. 4B is a top view of the interposer of FIG. 4A. In this embodiment, metal is deposited as a layer onto the top surface of the substrate 440 and patterned over the edge 485 of the chip 410, covering part of the mating surface 480 (FIG. 4A) so that metallization on the top surface is connected to the edge and mating surface metallization.

Figure 5A:
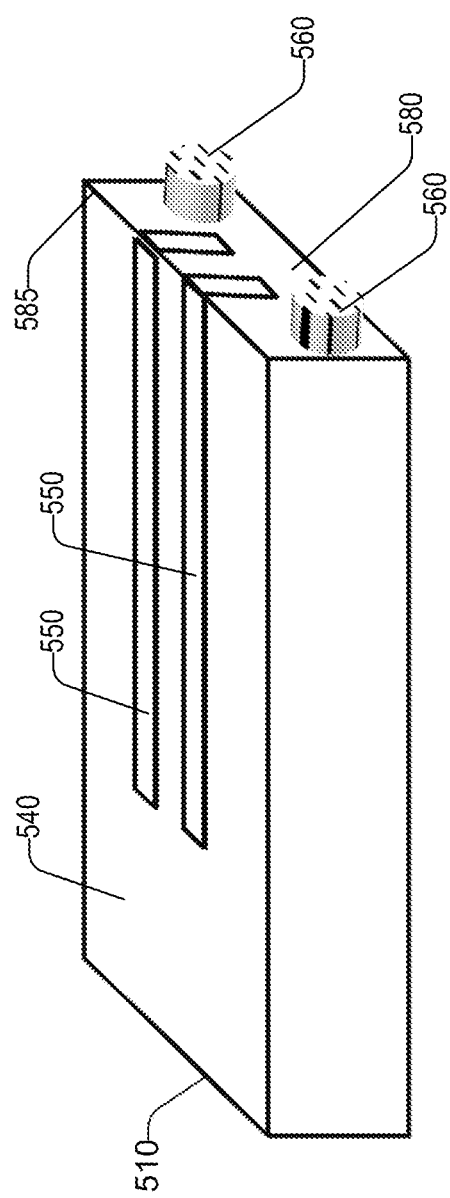
FIG. 5A is a side, top perspective view of an interposer with an edge based capacitor and stand-offs, for use in a quantum computing device, according to an embodiment.

FIGS. 5A and 5B show an embodiment similar to the embodiment shown in FIGS. 4A and 4B. The interposer chip 510 includes the signal lines 550 of superconducting metal on the top surface and over the edge 585. The interposer chip 510 shown also includes one or more standoffs 560 positioned on the mating surface 580 (FIG. 5A). When interposer chips 510 are arranged in a capacitor circuit connecting separate modules, the standoffs 560 define a separation gap between the chip substrates 540. Embodiments may include standoffs 560 on only one of the interposers 510 or on both interposers 510. When both interposers 510 include a standoff 560, the standoffs 560 from respective substrates 540 may be aligned to each other so that the length of standoffs 560 from respective interposers 510 are considered when designing the separation between substrates 540 and the resulting target capacitance in the connection.

Figure 6A:
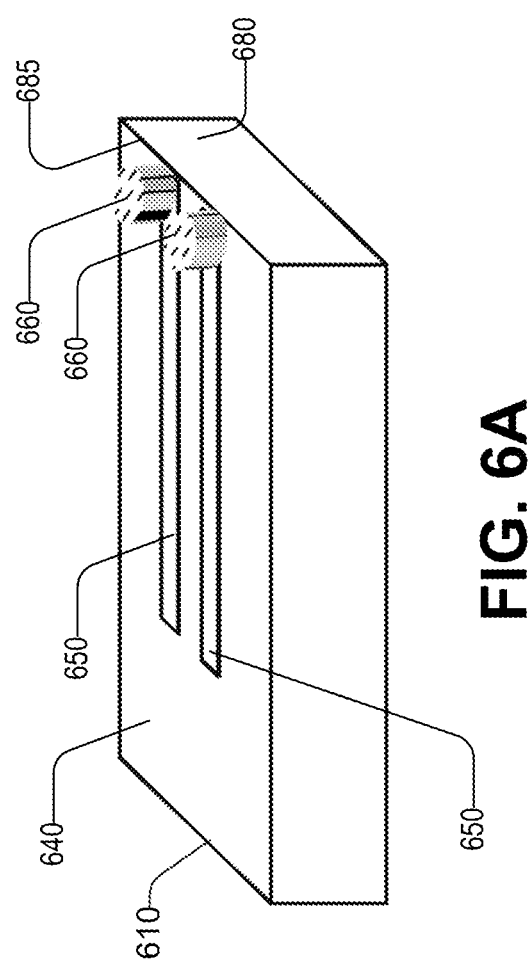
FIG. 6A is a side, top perspective view of an interposer with an edge based capacitor and capacitive bumps, for use in a quantum computing device, according to an embodiment.
Figure 6B:
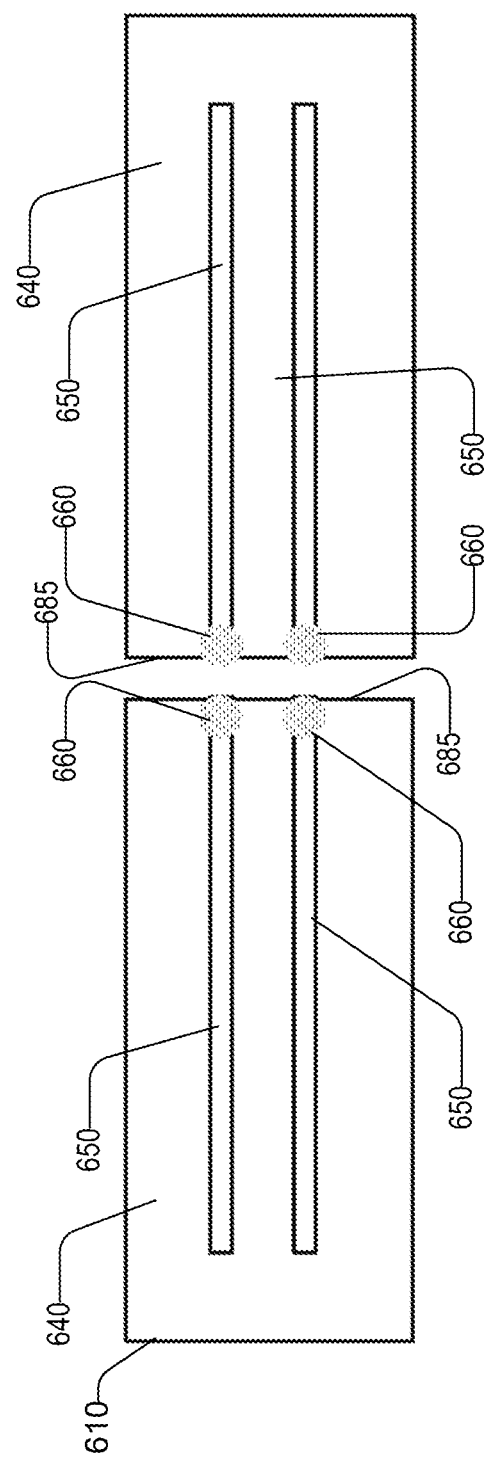
FIG. 6B is a top view of a quantum computing device connection, using two of the interposers shown in FIG. 6A.

Referring now to FIGS. 6A and 6B, an interposer 610 is shown that is similar to the interposers 310 (FIGS. 3A, 3B and 3C), 410 (FIGS. 4A and 4B), and 510 (FIGS. 5A and 5B), except that the metallization for the signal lines 650 may be deposited only on the top surface of the substrate 640 (and not over the edge 685 or onto the mating surface 680 as shown in FIG. 6A). The interposer 610 may include bumps 660 positioned on the top surface of the substrate 640. The bumps 660 may be metallic (for example, solder bumps). The bumps 660 are electrically connected to the signal lines 650. The bumps 660 may be positioned on or proximate the distal ends of the signal lines 650. When opposing interposers 610 are positioned near each other, the bumps 660 form a capacitance field in cooperation with each other bump 660.

Figure 7A:
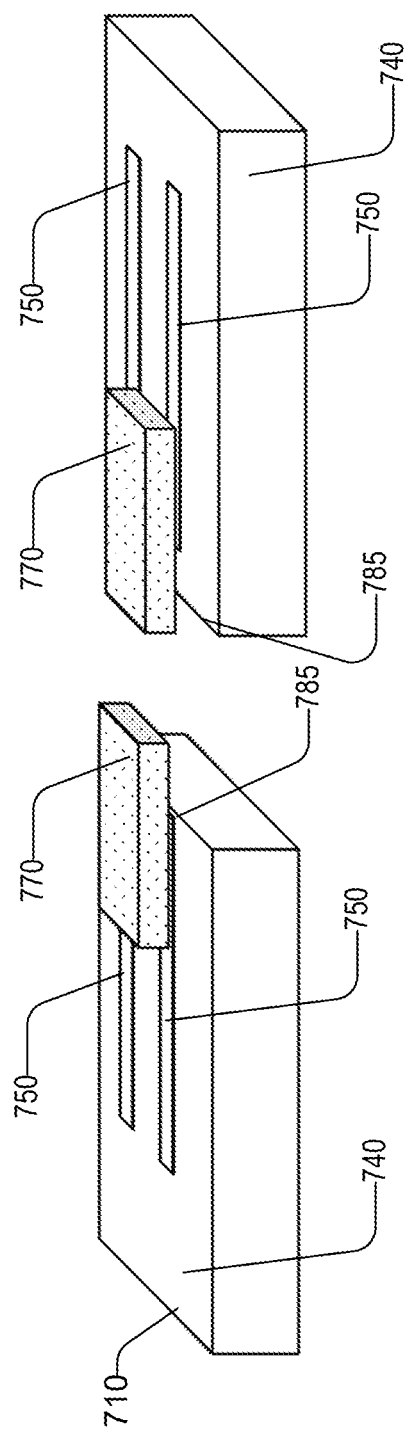
FIG. 7A is a side, top perspective view of an interposer with an edge based capacitor and coupling chips, for use in a quantum computing device, according to an embodiment.
Figure 7B:
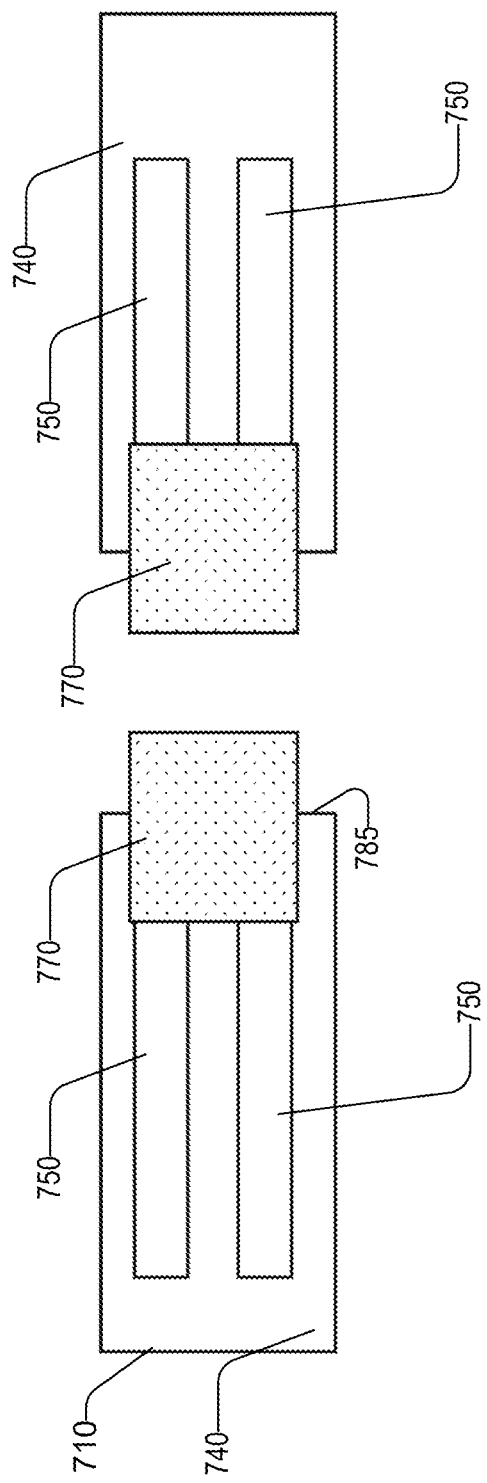
FIG. 7B is a top view of a quantum computing device connection, using two of the interposers shown in FIG. 7A.

FIGS. 7A and 7B show another embodiment of an interposer 710 that is similar to the interposer 610 except that instead of using bumps 660 as shown in FIGS. 6A and 6B, a coupling chip 770 on the top surface of the substrate 740 may bridge the signal lines 750. More specifically, FIG. 7A is a side, top perspective view of an interposer with an edge based capacitor and coupling chips, for use in a quantum computing device, according to an embodiment. FIG. 7B is a top view of a quantum computing device connection, using two of the interposers shown in FIG. 7A. The coupling chip 770 may be metallic. A distal end of the coupling chip 770 may project past the edge 785 of the substrate 740. When a pair of interposers 710 are positioned for an electrical connection, the distal ends of respective coupling chips 770 form a capacitance based coupling of one interposer 710 to the other interposer 710.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of these aspects, nor the discussions relating to these aspects, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. These parameters are intended to have a reasonable range that is consistent with the functions to which these parameters relate and with what is customary in the art to which they pertain.

Numerous other embodiments are also contemplated. These embodiments include embodiments that have fewer, additional, and/or different components, steps, features, objects, benefits and advantages. These embodiments also include embodiments in which the components and/or steps are arranged and/or ordered differently.

While the foregoing has been described in conjunction with exemplary embodiments, it is understood that the term "exemplary" is merely meant as an example, rather than the best or optimal embodiment. Except as stated immediately above, nothing that has been stated or illustrated is intended or should be interpreted to cause a dedication of any component, step, feature, object, benefit, advantage, or equivalent to the public, regardless of whether any one of these aspects is or is not recited in the claims.

It will be understood that the terms and expressions used herein have the ordinary meaning as is accorded to such terms and expressions except where specific meanings have otherwise been set forth herein. Relational terms such as "first" and "second" and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A quantum computing chip device, comprising:
    a first chip including a first signal line including a distal end positioned proximate to or on an edge of the first chip, and a proximal end positioned away from the edge of the first chip;
    a trench in a substrate of the first chip, wherein the first signal line is embedded in the trench; and
    a second chip including a second signal line including a distal end positioned proximate to or on an edge of the second chip and a proximal end positioned away from the edge of the second chip,
    wherein the second signal line of the second chip is disposed in alignment for a capacitive bus connection to the first signal line of the first chip; and
    wherein the first signal line and the second signal line are configured to conduct a signal.

2. A quantum computing chip device, comprising:
    a first chip including a first signal line including a distal end positioned proximate to or on an edge of the first chip, and a proximal end positioned away from the edge of the first chip; and
    a second chip including a second signal line including a distal end positioned proximate to or on an edge of the second chip and a proximal end positioned away from the edge of the second chip,
    wherein the distal end of the first signal line is spaced from the edge of the first chip by a substrate material;
    wherein the second signal line of the second chip is disposed in alignment for a capacitive bus connection to the first signal line of the first chip; and
    wherein the first signal line and the second signal line are configured to conduct a signal.

3. The quantum computing chip device of claim 1, wherein the first signal line is positioned on a top surface of the first chip, over the edge of the first chip, and onto a sidewall mating surface of a first interposer.

4. The quantum computing chip device of claim 1, further comprising a metallic chip coupled to the first signal line, wherein the metallic chip projects past the edge of the first chip and is disposed to provide the capacitive bus connection by a capacitance in cooperation with a second metallic chip coupled to the second signal line.

5. The quantum computing chip device of claim 1, further comprising a capacitor pad on a distal end of the first signal line and adjacent to the edge of the first chip.

6. The quantum computing chip device of claim 5, wherein the capacitor pad is embedded in a substrate of the first chip and spaced from the edge of the first chip.

7. The quantum computing chip device of claim 1, further comprising a front face of the distal end of the first signal line, wherein the front face of the distal end of the first signal line is exposed through a side wall of the first chip.

8. The quantum computing chip device of claim 7, wherein the front face of the distal end of the first signal line is flush with the side wall of the first chip.

9. The quantum computing chip device of claim 1, further comprising a standoff on a side wall of the first chip.

10. The quantum computing chip device of claim 1, further comprising a bump on a top surface of the first chip.

11. The quantum computing chip device of claim 1, further comprising a first bump coupled to the first signal line, and disposed to provide capacitance in cooperation with a second bump positioned on the second signal line.

12. A quantum computing chip, comprising:
    a substrate including a first end and a second end;
    a first superconducting metal signal line including:
        a first end positioned intermediate the first end of the substrate and the second end of the substrate, and
        a second end positioned on an edge of the second end of the substrate;
    a second superconducting metal signal line including:
        a first end positioned intermediate the first end of the substrate and the second end of the substrate, and
        a second end positioned proximate an edge of the second end of the substrate, wherein the first superconducting metal signal line and the second superconducting metal signal line are configured to generate a capacitive field; and
    a metallic chip coupled to the first superconducting metal signal line and to the second end of the second superconducting metal signal line, and wherein one end of the metallic chip projects beyond the second end of the substrate.

13. A quantum computing chip, comprising:
    a substrate including a first end and a second end;
    a first superconducting metal signal line including:
        a first end positioned intermediate the first end of the substrate and the second end of the substrate, and
        a second end positioned on an edge of the second end of the substrate;
    a second superconducting metal signal line including:
        a first end positioned intermediate the first end of the substrate and the second end of the substrate, and
        a second end positioned proximate an edge of the second end of the substrate, wherein the first superconducting metal signal line and the second superconducting metal signal line are configured to generate a capacitive field; and one or more standoffs positioned on a side wall of the second end of the substrate.

14. The quantum computing chip of claim 13, wherein the second end of the first superconducting metal signal line and the second end of the second superconducting metal signal line are positioned in a route extending from a top surface of the substrate, over the edge of the second end of the substrate, and over a side wall of the second end of the substrate.

15. The quantum computing chip of claim 13, wherein the second end of the first superconducting metal signal line and the second end of the second superconducting metal signal line are exposed through the second end of the substrate.

16. The quantum computing chip of claim 13, wherein the first superconducting metal signal line and the second superconducting metal signal line are embedded into the substrate.

17. The quantum computing chip of claim 13, wherein the one or more standoffs are configured to provide a spacing based on a target capacitance in a coupling using the quantum computing chip.

18. A quantum computing chip, comprising:
a substrate including a first end and a second end;
a first superconducting metal signal line including:
    a first end positioned intermediate the first end of the substrate and the second end of the substrate, and
    a second end positioned on an edge of the second end of the substrate;
a second superconducting metal signal line including:
    a first end positioned intermediate the first end of the substrate and the second end of the substrate, and
    a second end positioned proximate an edge of the second end of the substrate, wherein the first superconducting metal signal line and the second superconducting metal signal line are configured to generate a capacitive field; and
a first conductive bump positioned on the first superconducting metal signal line and a second conductive bump positioned on the second superconducting metal signal line, wherein the capacitive field is formed between the first conductive bump and the second first conductive bump.

19. A method of manufacturing a quantum computing device, including:
forming a first chip substrate;
forming a first of one or more signal lines of a superconducting metal on a top surface of the first chip substrate, proximate to or in contact with, an edge of the top surface of the first chip substrate;
forming a second chip substrate;
forming a second of one or more signal lines of the superconducting metal on a top surface of the second chip substrate, proximate to or in contact with, an edge of the top surface of the second chip substrate;
forming a capacitive based bus connection between a first distal end of the first of one or more signal lines and a second distal end of the second one or more signal lines
forming a trench in the first substrate and depositing the superconducting metal into the trench, wherein the trench and deposited superconducting metal define the first one or more signal lines.

20. The method of claim 19, further comprising:
forming a first conductive bump on the first one or more signal lines; and
forming a second conductive bump on the second one or more signal lines, wherein the first conductive bump and the second conductive bump form the capacitive based bus connection.

21. The method of claim 19, further comprising:
forming a first conductive chip connected to the first one or more signal lines and projecting past the edge of the top surface of the first chip substrate; and
forming a second conductive chip connected to the second one or more signal lines and projecting past the edge of the top surface of the second chip substrate, wherein the first conductive chip and the second conductive chip form the capacitive based bus connection.

22. The method of claim 19, further comprising:
depositing a layer of the superconducting metal onto the top surface of the first substrate; and
depositing the superconducting metal over an edge of the first substrate and onto a mating surface of the first substrate.

* * * * *